US010651427B2

(12) United States Patent
Youn et al.

(10) Patent No.: US 10,651,427 B2
(45) Date of Patent: May 12, 2020

(54) ORGANIC LIGHT EMITTING DIODE DISPLAY DEVICE

(71) Applicant: LG Display Co., Ltd., Seoul (KR)

(72) Inventors: Woo-Ram Youn, Paju-si (KR); Yong-Hoon Choi, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/168,056

(22) Filed: Oct. 23, 2018

(65) Prior Publication Data

US 2019/0131580 A1 May 2, 2019

(30) Foreign Application Priority Data

Oct. 31, 2017 (KR) .................. 10-2017-0144068

(51) Int. Cl.
*H01L 51/52* (2006.01)
*H01L 51/50* (2006.01)
*H01L 27/32* (2006.01)

(52) U.S. Cl.
CPC ...... *H01L 51/5275* (2013.01); *H01L 27/3258* (2013.01); *H01L 51/5012* (2013.01); *H01L 51/5206* (2013.01); *H01L 51/5209* (2013.01); *H01L 51/5221* (2013.01); *H01L 51/5225* (2013.01); *H01L 51/5256* (2013.01); *H01L 51/5271* (2013.01); *H01L 27/322* (2013.01); *H01L 27/3246* (2013.01)

(58) Field of Classification Search
CPC ............. H01L 51/5275; H01L 51/5221; H01L 51/5256; H01L 51/5206; H01L 51/5012; H01L 27/322; H01L 27/3246; H01L 51/5209; H01L 27/3258; H01L 51/5271; H01L 51/5225

See application file for complete search history.

(56) References Cited

U.S. PATENT DOCUMENTS

2015/0318334 A1* 11/2015 Kim ..................... H01L 27/3213
257/40
2016/0293677 A1* 10/2016 Oooka ................ H01L 51/5228

FOREIGN PATENT DOCUMENTS

JP        2014-225329 A    12/2014

* cited by examiner

*Primary Examiner* — Syed I Gheyas
(74) *Attorney, Agent, or Firm* — Seed IP Law Group LLP

(57) ABSTRACT

The present disclosure relates to an organic light-emitting diode (OLED) display, and more particularly, to an OLED display having improved light extraction efficiency. According to the present disclosure, since a plurality of holes are formed in a first electrode of a light-emitting diode and a insulating material is disposed in each of the holes, an organic light-emitting layer and a second electrode constitute a microlens, thereby improving light extraction efficiency of the OLED display. As a result, brightness may be improved, and power consumption may be reduced. In particular, since the plurality of holes are formed in the first electrode and the insulating material is disposed in each of the plurality of holes, an interface between the insulating material and the first electrode is decreased, thereby further improving light extraction efficiency.

19 Claims, 7 Drawing Sheets

ORGANIC LIGHT EMITTING DIODE DISPLAY DEVICE

CROSS-REFERENCE TO RELATED APPLICATIONS

This application claims the benefit under 35 U.S.C. § 119(a) of Korean Patent Application No. 2017-0144068, filed Oct. 31, 2017, in the Korean Intellectual Property Office, which is incorporated herein by reference in its entirety.

BACKGROUND

Technical Field

The present disclosure relates to an organic light emitting diode display device, and more particularly, to an organic light emitting diode display device having improved light extraction efficiency.

Description of the Related Art

Recently, with the advent of an information-oriented society, as interest in information displays for processing and displaying a massive amount of information and demand for portable information media have increased, a display field has rapidly advanced. Thus, various light and thin flat panel display devices have been developed and highlighted.

As specific examples of the flat display devices, there are a liquid crystal display (LCD) device, a plasma display panel (PDP) device, a field emission display (FED) device, an electroluminescence display (ELD) device, an organic light emitting diode (OLED) display device, and the like. The flat display devices exhibit excellent characteristics in terms of thinning, lightening, and reductions in the power consumption thereof and thus have rapidly replaced the conventional cathode ray tube (CRT) displays.

Among the flat panel display devices, the OLED display device is an emissive type device and does not require a backlight unit used in a non-emissive type device, i.e., the LCD device. As a result, the OLED display device has light weight and a thin profile.

In addition, the OLED display device has advantages of a viewing angle, a contrast ratio, and power consumption as compared with the LCD device. Furthermore, the OLED display device may be driven with a low direct current (DC) voltage and has rapid response speed. Moreover, since inner elements of the OLED display device have a solid phase, the OLED display device has high durability against an external impact and has a wide available temperature range.

Specifically, since the OLED display device is manufactured through a simple process, manufacturing costs may be reduced as compared with the LCD device.

However, in the OLED display device, while light emitted from an organic light-emitting layer passes through various components and is emitted to the outside, a large portion of the light is lost. Thus, light emitted to the outside of the OLED display device is only about 20% of the light emitted from the organic light-emitting layer.

Here, since an amount of the light emitted from the organic light-emitting layer is increased along with an amount of a current applied to the OLED display device, it is possible to further increase brightness of the OLED display device by applying more currents to the organic light-emitting layer. However, in this case, power consumption is increased, and lifetime of the OLED display device is also reduced.

Therefore, various researches have recently been conducted to improve the light extraction efficiency of the OLED display device.

BRIEF SUMMARY

The present disclosure has been made to solve the above problems and is directed to providing an organic light emitting diode display device having improved light extraction efficiency.

As a result, the present disclosure is directed to also improving efficiency by improving lifespan of the organic light emitting diode display device.

In order to achieve the objects as described above, the present disclosure provides an organic light emitting diode display device including a plurality of pixel regions, each of the pixel regions including a light-emitting diode (LED), the LED including: a first electrode having a plurality of holes formed therein; an insulating material disposed in each of the holes and protruding from the first electrode; an organic light-emitting layer disposed on upper surfaces of the first electrode and the insulating material; and a second electrode disposed on the organic light-emitting layer, wherein both of the organic light-emitting layer and the second electrode have a shape that conforms to the upper surfaces of the first electrode and the insulating material.

It is to be understood that both the foregoing general description and the following detailed description are exemplary and explanatory and are intended to provide further explanation of the invention as claimed.

BRIEF DESCRIPTION OF THE SEVERAL VIEWS OF THE DRAWINGS

The accompanying drawings, which are included to provide a further understanding of the disclosure, are incorporated in and constitute a part of this specification, illustrate implementations of the disclosure and together with the description serve to explain the principles of embodiments of the disclosure.

DETAILED DESCRIPTION

Hereinafter, embodiments according to the present disclosure will be described in detail with reference to the drawings.

First Embodiment

Figure 1:
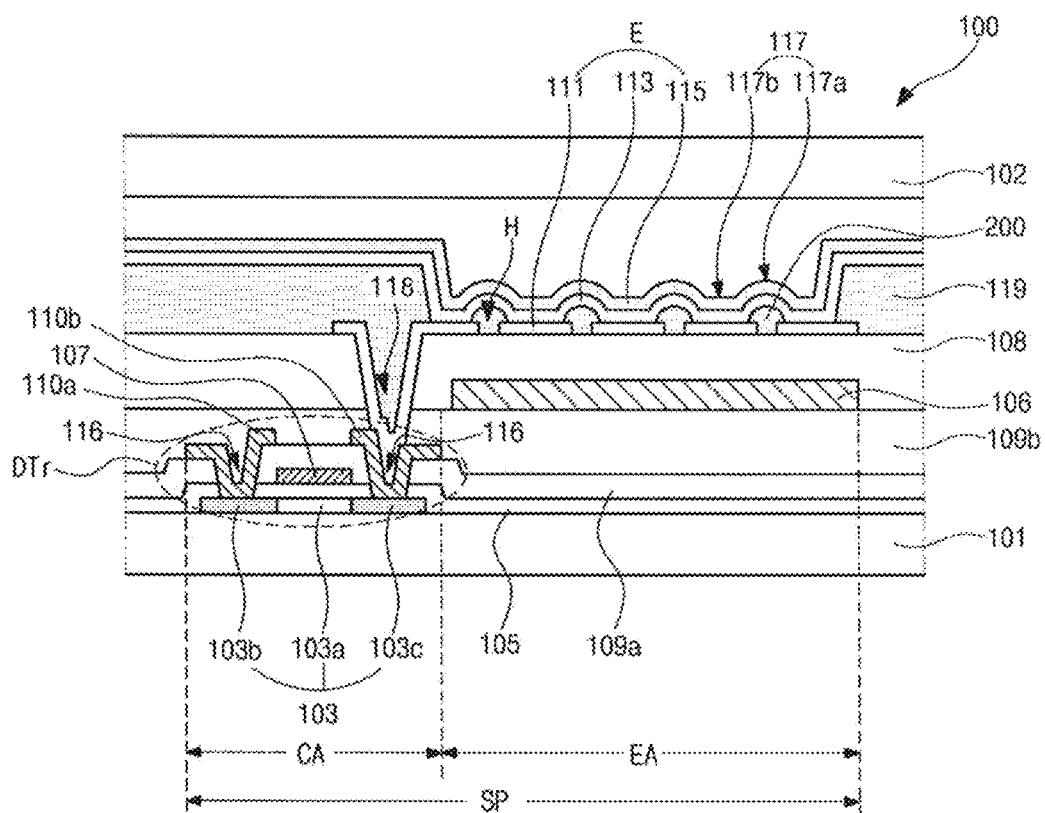
FIG. 1 is a schematic cross-sectional view illustrating an organic light-emitting diode (OLED) display according to a first embodiment of the present disclosure.

FIG. 1 is a schematic cross-sectional view illustrating an organic light-emitting diode (OLED) display according to a first embodiment of the present disclosure.

Prior to the description, an OLED display 100 according to an embodiment of the present disclosure is classified into a top emission type or a bottom emission type according to a transmission direction of emitted light. Hereinafter, the bottom emission type will be described as an example in the present disclosure.

For convenience of description, each pixel region SP is defined to have an emission region EA in which a light-emitting diode (LED) E is provided to substantially implement an image, and a circuit region CA, which is disposed along an edge of the emission region EA, in which a driving thin film transistor DTr is formed.

As shown, in the OLED display 100 according to the first embodiment of the present disclosure, a substrate 101, on which the driving thin film transistor DTr and the LED E are formed, is encapsulated by a protective film 102.

More specifically, a semiconductor layer 103 is disposed in the circuit region CA of each pixel region SP on the substrate 101. The semiconductor layer 103 is made of silicon and has an active region 103A configured to constitute a channel and disposed at a central portion thereof, a source region 103b, and a drain region 103c, which are doped with high concentration impurities and are disposed on both side surfaces of the active region 103a.

A gate insulating layer 105 is disposed on an upper portion of the semiconductor layer 103.

A gate electrode 107 and a gate line, which is not shown in the drawings and extends in one direction, are provided on an upper portion of the gate insulating layer 105 so as to correspond to the active region 103a of the semiconductor layer 103.

In addition, a first interlayer insulating layer 109a is disposed on the gate electrode 107 and the gate line (not shown). In this case, the first interlayer insulating layer 109a and the gate insulating layer 105 below the first interlayer insulating layer 109a have first and second semiconductor layer contact holes 116 configured to respectively expose the source and drain regions 103b and 103c disposed on both side surfaces of the active region 103a.

Next, source and drain electrodes 110a and 110b are spaced apart from each other on an upper portion of the first interlayer insulating layer 109a having the first and second semiconductor layer contact holes 116 and are respectively in contact with the source and drain regions 103b and 103c exposed through the first and second semiconductor layer contact holes 116.

A second interlayer insulating layer 109b is disposed on the upper portion of the first interlayer insulating layer 109a to be exposed between the source electrode 110a and the drain electrode 110b.

In this case, the source and drain electrodes 110a and 110b, the semiconductor layer 103 having the source and drain regions 103b and 103c in contact with the source and drain electrodes 110a and 110b, the gate insulating layer 105 disposed on the upper portion of the semiconductor layer 103, and the gate electrode 107 constitute the driving thin film transistor DTr.

Although not shown in the drawings, data lines (not shown) are provided to cross the gate lines (not shown) and define the pixel regions SP. A switching thin film transistor (not shown) has the same structure as the driving thin film transistor DTr and is connected to the driving thin film transistor DTr.

The switching thin film transistor (not shown) and the driving thin film transistor DTr are illustrated in the drawings as having a top gate type in which the semiconductor layer 103 may be formed as a polysilicon semiconductor layer or an oxide semiconductor layer. As a modified example, the switching thin film transistor (not shown) and the driving thin film transistor DTr may have a bottom gate type in which the semiconductor layer 103 is made of intrinsic amorphous silicon and doped amorphous silicon.

The substrate 101 may be mainly made of a glass material, but may be made of a transparent plastic material such as a polyimide material, which is bendable or flexible. When a plastic material is used as a material of the substrate 101, polyimide having high heat resistance, which is able to withstand high temperature, may be used, considering that a high temperature deposition process is performed on the substrate 101. An entire surface of the substrate 101 may be covered with at least one buffer layer (not shown).

In this case, the driving thin film transistor DTr provided in the circuit region CA may have a characteristic in which a threshold voltage thereof is shifted by light. To prevent this, the OLED display 100 according to the present application may further include a light shielding layer (not shown) provided below the semiconductor layer 103.

The light shielding layer (not shown) is provided between the substrate 101 and the semiconductor layer 103 to block light incident on the semiconductor layer 103 through the substrate 101 and to minimize or prevent a change in a threshold voltage of a transistor, caused by external light. The light shielding layer (not shown) is covered with the buffer layer (not shown).

A wavelength conversion layer 106 is disposed on an upper portion of the second interlayer insulating layer 109b corresponding to the emission region EA of each pixel region SP.

The wavelength conversion layer 106 includes a color filter which transmits only a wavelength of a color set in the pixel region SP among white light emitted to the substrate 101 from the LED E.

In an example, the wavelength conversion layer 106 may transmit only a red, green, or blue wavelength. For example, in the OLED display 100 according to the present application, one unit pixel may include adjacent first to third pixel regions SP. In this case, the wavelength conversion layer 106 provided in the first pixel region may include a red color filter, the wavelength conversion layer 106 provided in the second pixel region may include a green color filter, and the wavelength conversion layer 106 provided in the third pixel region may include a blue color filter.

Additionally, in the OLED display 100 according to the present application, one unit pixel may further include a white pixel in which the wavelength conversion layer 106 is not formed.

In another example, the wavelength conversion layer 106 may include quantum dots which have a size capable of emitting light with a color set in each pixel region SP according to white light emitted to the substrate 101 from the LED E. Here, the quantum dots may be selected from quantum dots of CdS, CdSe, CdTe, ZnS, ZnSe, GaAs, GaP, GaAs—P, Ga—Sb, InAs, InP, InSb, AlAs, AlP, AlSb, and the like.

For example, the wavelength conversion layer 106 of the first pixel region may include quantum dots of CdSe or InP, the wavelength conversion layer 106 of the second pixel region may include quantum dots of CdZnSeS, and the wavelength conversion layer 106 of the third pixel region may include quantum dots of ZnSe. As described above, the OLED display 100, in which the wavelength conversion layer 106 includes quantum dots, may have a high color gamut.

In another example, the wavelength conversion layer 106 may include a color filter containing quantum dots.

An overcoat layer 108, which has a drain contact hole 118 configured to expose the second interlayer insulating layer 109b and the drain electrode 110b, is disposed on an upper portion of the wavelength conversion layer 106. A first electrode 111 is disposed on an upper portion of the overcoat layer 108, and the first electrode 111 connected to the drain electrode 110b of the driving thin film transistor DTr and made of a material having a relatively high work function value constitute an anode of the LED E.

The first electrode 111 may be made of a metal oxide such as indium tin oxide (ITO) or indium zinc oxide (IZO), a mixture of a metal and an oxide such as ZnO:Al or $SnO_2$:Sb, or a conductive polymer such as poly(3-methylthiophene), poly[3,4-(ethylene-1,2-dioxy)thiophene] (PEDT), polypyrrole, or polyaniline. In addition, the first electrode 111 may be made of a carbon nano tube (CNT), graphene, a silver nanowire, or the like.

The first electrode 111 is disposed for each pixel region SP, and a bank 119 may be disposed between the first electrodes 111 disposed for each pixel region SP.

That is, the bank 119 is disposed along an edge of each pixel region SP. The first electrode 111 is separately disposed for each pixel region SP by the bank 119, which is a boundary portion of each pixel region SP.

The bank 119 may be made of a transparent insulating material having a refractive index of about 1.5. For example, the bank 119 may be made of at least one selected from an acrylic-based resin, an epoxy resin, a phenol resin, a polyamide-based resin, a polyimide-based resin, an unsaturated polyester-based resin, a polyphenylene-based resin, a polyphenylene sulfide-based resin, benzocyclobutene, and photoresist, but the present disclosure is not limited thereto. The bank 119 may be made of any insulating material having a refractive index of about 1.5.

Here, in the OLED display 100 according to the first embodiment of the present disclosure, the first electrode 111 has a plurality of holes H spaced apart from each other by a certain distance. The plurality of holes H expose the overcoat layer 108 disposed on a lower portion of the first electrode 111.

A insulating material 200 is disposed on an upper portion of the first electrode 111. The insulating material 200 has a semicircular shape which is disposed in each of the holes H formed in the first electrode 111 and protrudes convexly to the protective film 102 from the first electrode 111.

The insulating material 200 may include the same material as the bank 119 disposed along the edge of each pixel region SP in some embodiments, but this is not required.

That is, the insulating material 200 may be made of a transparent insulating material. A traveling path of light emitted from the LED E is changed due to the transparent insulating material 200, thereby increasing light extraction efficiency. This will be described in more detail later.

Since the insulating material 200 is made of the same material as the bank 119 in some embodiments in might be called a bank, a bank pattern or a bank pattern layer. The insulating material 200 may be formed in each of the holes H of the first electrode 111 by using a process of forming the bank 119 without a separate process. Accordingly, the separate process is not required. For example, the bank 119 and the insulating material 200 may be formed simultaneously by using a transflective mask.

An organic light-emitting layer 113 is disposed on the first electrode 111 and the insulating material 200. The organic light-emitting layer 113 may include a single layer made of a light-emitting material. In order to improve luminous efficiency, the organic light-emitting layer 113 may include a multi-layer of a hole injection layer, a hole transport layer, an emitting material layer, an electron transport layer, and an electron injection layer. Namely, the light emitting layer is composed of a plurality of different sublayers of which some of the sublayers emit light and some of the sublayers do not emit light.

A second electrode 115, which constitutes a cathode, is disposed on an entire upper surface of the organic light-emitting layer 113.

The second electrode 115 may be made of a material having a relatively low work function value. In this case, the second electrode 115 may have a double-layered structure and may include a single layer of an alloy containing a first metal such as Ag, which has a relatively low work function, and a second metal such as Mg at a certain ratio, or multiple layers thereof.

In the OLED display 100, when a certain voltage is applied to the first electrode 111 and the second electrode 115 according to a selected signal, holes injected from the first electrode 111 and electrons injected from the second electrode 115 are transported to the organic light-emitting layer 113 to form excitons. When the excitons transit from an excited state to a ground state, light is generated and emitted in the form of visible light.

In this case, the emitted light passes through the transparent first electrode 111 and is emitted to the outside, so that the OLED display 100 may implement any image.

Here, both of the organic light-emitting layer 113 and the second electrode 115 sequentially disposed on the first electrode 111 and the insulating material 200 have a shape that conforms to the upper surfaces of the first electrode 111 and the insulating material 200 protruding convexly from the first electrode 111. In a preferred embodiment, layers 113 and 115 are deposited as conformal layers, meaning that they have a uniform thickness at all locations they are deposited and their upper surface, after being deposited, has generally the same shape as the surface on which they are deposited.

Therefore, the organic light-emitting layer 113 and the second electrode 115 have a convex portion 117a corresponding to the insulating material 200 and a flat portion 117b corresponding to the first electrode 111 to constitute a microlens 117.

The protective film 102 in the form of a thin film is formed above the driving thin film transistor DTr and the LED E, so that the OLED display 100 is encapsulated through the protective film 102.

Here, in order to prevent external oxygen and moisture from permeating into the OLED display 100, the protective film 102 includes at least two stacked inorganic protective films. In this case, it is preferable that an organic protective film is interposed between the two inorganic protective films to compensate for impact resistance of the inorganic protective films.

Since moisture and oxygen are prevented from permeating into side surfaces of the organic protective film in such a structure in which the organic protective film and the inorganic protective film are alternately and repeatedly stacked, it is preferable that the inorganic protective film completely covers the organic protective film.

Accordingly, the OLED display 100 can prevent moisture and oxygen from permeating into the OLED display 100 from the outside.

As described above, in the OLED display 100 according to the first embodiment of the present disclosure, since the plurality of holes H are formed in the first electrode 111 of the LED E and the insulating material 200 protruding convexly from the first electrode 111 is disposed in each of the holes H, a path of light emitted from the LED E can be changed to improve light extraction efficiency, thereby improving brightness and reducing power consumption.

That is, since the insulating material 200 protruding convexly from the first electrode 111 is provided, the organic light-emitting layer 113 and the second electrode 115 sequentially disposed on the first electrode 111 and the insulating material 200 have the convex portion 117a and the flat portion 117b. Thus, the organic light-emitting layer 113 and the second electrode 115 constitute the microlens 117.

Therefore, light extraction efficiency of the OLED display 100 is improved.

In particular, in the OLED display 100 according to the first embodiment of the present disclosure, since the plurality of holes H are formed in the first electrode 111 and the insulating material 200 is disposed in each of the plurality of holes H, an interface between the insulating material 200 and the first electrode 111 is reduced. As a result, light extraction efficiency is also improved.

Figure 2:
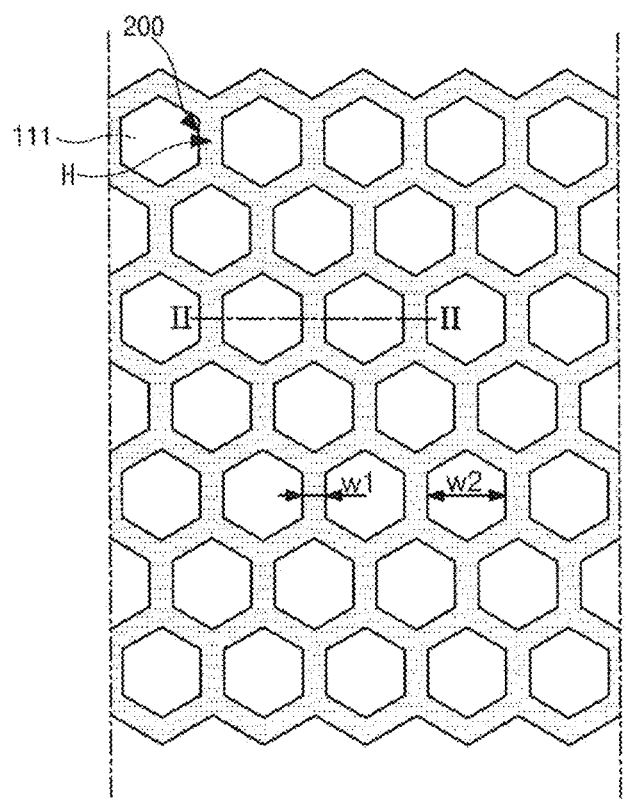
FIG. 2 is a schematic plan view illustrating an arrangement structure of a insulating material of the OLED display according to the first embodiment of the present disclosure.

FIG. 2 is a schematic plan view illustrating an arrangement structure of the insulating material 200 of the OLED display 100 according to the first embodiment of the present disclosure.

As shown, the first electrode 111, which is disposed on the upper portion of the overcoat layer (108 of FIG. 1) so as to correspond to the emission region (EA of FIG. 1) of each pixel region (SP of FIG. 1), has the plurality of holes H spaced apart from each other by a certain distance. In this case, the first electrode 111 defined by the holes H may have a hexagonal shape when viewed from above, but the present disclosure is not limited thereto. The first electrode 111 may have various overall shapes such as a hemispherical shape, a semi-ellipsoidal shape, and a rectangular shape.

The plurality of holes H may be disposed in a hexagonal honeycomb structure when viewed from above. In other words, one hole H having a hexagonal shape and another adjacent hole H, which are spaced apart from each other by a certain distance, may share one side to integrally form a hexagonal honeycomb structure.

Therefore, the insulating materials 200 disposed in the holes H may also be disposed in a hexagonal honeycomb structure.

A width w1 of the insulating material 200 disposed in the hole H may be in a range of 8,000 Å to 12,000 Å. Due to limitations in an exposure ratio and a material itself in a current process, it is very difficult to form the insulating material 200 such that the width W1 is less than 8,000 Å. In addition, when the width w1 of the insulating material 200 is greater than 12,000 Å, a non-emission region is increased by the insulating material 200 to affect brightness of the OLED display (100 of FIG. 1).

Therefore, it is preferable that the insulating material 200 is formed to have the width w1 of 8,000 Å to 12,000 Å.

Here, it is preferable that a width w2 between adjacent insulating materials 200 is about three times the width w1 of the insulating material 200 such that brightness of the OLED display (100 of FIG. 1) is not affected by the insulating material 200. The area of the metal is therefore about three times greater than the area of the holes in the first electrode.

Figure 3:
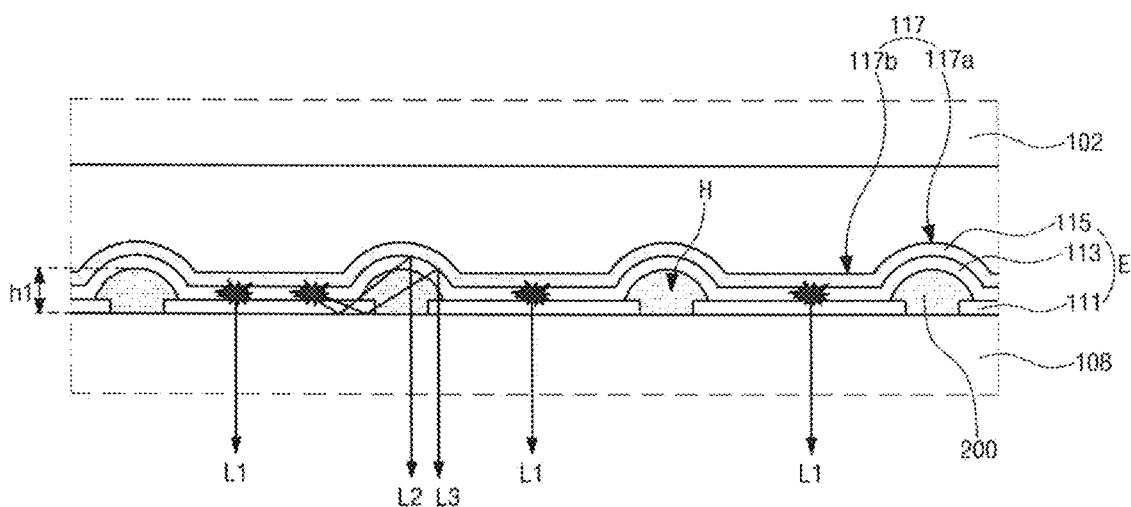
FIG. 3 is a cross-sectional view taken along line II-II of FIG. 2, and schematically illustrates a state in which light is guided.

FIG. 3 is a cross-sectional view taken along line II-II of FIG. 2, and schematically illustrates a state in which light is guided.

As shown, the LED E including the first electrode 111, the organic light-emitting layer 113, and the second electrode 115 is disposed on the upper portion of the overcoat layer 108 corresponding to the emission region (EA of FIG. 1).

Here, the first electrode 111 has the plurality of holes H spaced apart from each other by a certain distance, and the insulating material 200 is disposed in each of the holes H. The insulating material 200 has a semicircular shape protruding convexly to the protective film (102 of FIG. 1) from each of the holes H of the first electrode 111 and is made of a transparent insulating material. The desired height and shape of the concave insulating material 200 is made by the following steps: forming an insulating material layer on the first electrode; forming first photoresist patterns having different thickness on the insulating material layer; first etching the insulating material layer using the first photoresist patterns; forming second photoresist patterns by ashing; second etching the insulating material layer using the second photoresist patterns; and removing the second photoresist patterns.

The organic light-emitting layer 113 and the second electrode 115 are sequentially disposed on the first electrode 111 and the insulating material 200. The organic light-emitting layer 113 and the second electrode 115 have the convex portion 117a corresponding to the insulating material 200 and the flat portion 117b corresponding to the first electrode 111 along the surfaces of the first electrode 111 and the insulating material 200 to constitute the microlens 117.

Here, since a refractive index of the organic light-emitting layer 113 is substantially the same as a refractive index of the first electrode 111, an optical path of light generated in the organic light-emitting layer 113 is not changed at an interface between the organic light-emitting layer 113 and the first electrode 111.

The organic light-emitting layer 113 and the first electrode 111 may have a refractive index in a range of 1.7 to 2.0.

Since the overcoat layer 108 has a refractive index of about 1.5, while light emitted from the organic light-emitting layer 113 passes through the first electrode 111 and is extracted to the outside of the substrate (101 of FIG. 1), the light emitted from the organic light-emitting layer 113 is totally reflected at an interface between the first electrode 111 and the overcoat layer 108.

In this case, among the light totally reflected at the interface between the first electrode 111 and the overcoat layer 108, light L1 is extracted to the outside of the substrate (101 of FIG. 1). However, some light has an angle greater than a total reflection critical angle and thus is trapped between the overcoat layer 108 and the first electrode 111 or between the first electrode 111 and the second electrode 115 without being extracted to the outside of the substrate 101.

Here, in the OLED display (100 of FIG. 1) according to the first embodiment of the present disclosure, since the organic light-emitting layer 113 and the second electrode 115 constitute the microlens 117, among light L2 and light L3 totally reflected at the interface between the first electrode 111 and the overcoat layer 108, the light L2 is extracted to the outside of the substrate (101 of FIG. 1) through multiple reflections by traveling at an angle smaller than a total reflection critical angle due to a curved shape of the convex portion 117a of the organic light-emitting layer 113 and the second electrode 115.

Therefore, light extraction efficiency is improved.

That is, although the OLED display (100 of FIG. 1) according to the first embodiment of the present disclosure does not include a separate microlens, the organic light-emitting layer 113 and the second electrode 115 may constitute the microlens 117 by the insulating material 200 and the first electrode 111, thereby improving light extraction efficiency.

In this case, total reflection may also be performed at the interface between the first electrode 111 and the insulating material 200. In the OLED display (100 of FIG. 1) according to the first embodiment of the present disclosure, the plurality of holes H are formed in the first electrode 111, and the insulating material 200 is disposed in each of the plurality of holes H, thereby reducing the interface between the insulating material 200 and the first electrode 111.

Therefore, among the light L2 and the light L3 totally reflected at the interface between the first electrode 111 and the insulating material 200 among the light emitted from the organic light-emitting layer 113, the light L3 is extracted to the outside of the substrate (101 of FIG. 1) through multiple reflections by traveling at an angle smaller than a total reflection critical angle due to the curved shape of the convex portion 117a of the organic light-emitting layer 113 and the second electrode 115. As a result, light extraction efficiency is also improved.

Figure 4A:
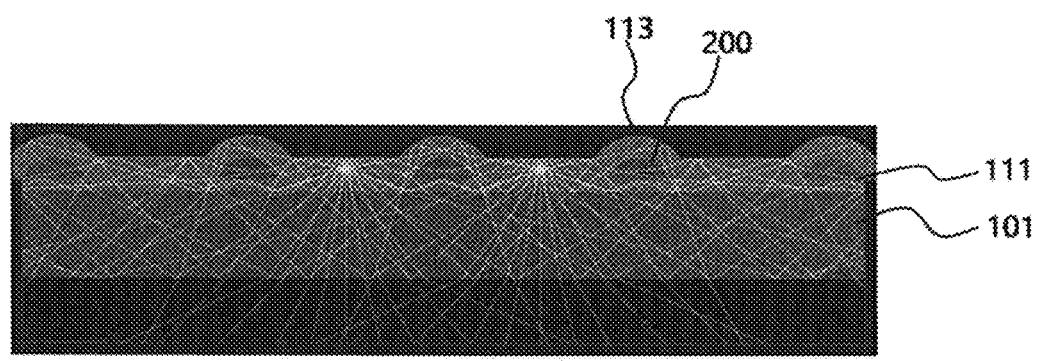
FIGS. 4A and 4B illustrate simulation results for a comparison of a measured light extraction state of the OLED display according to the first embodiment of the present disclosure.
Figure 4B:
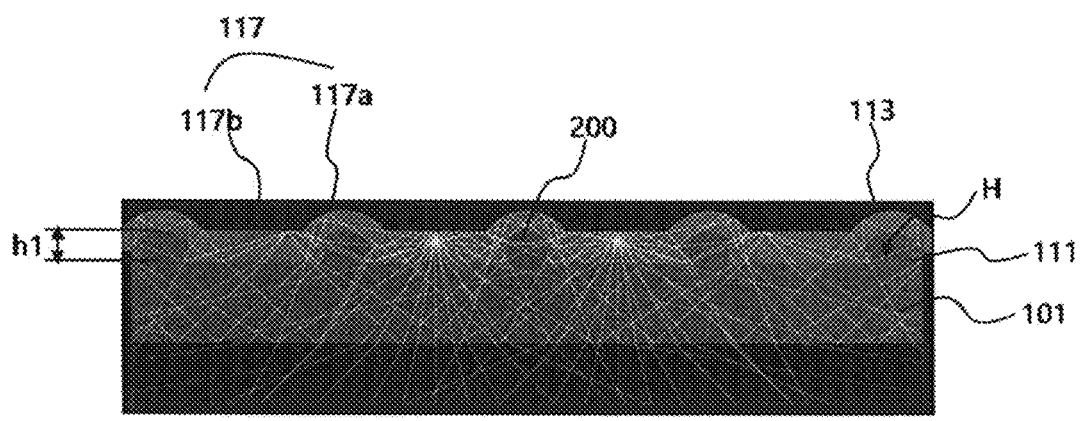
Figure 4C:
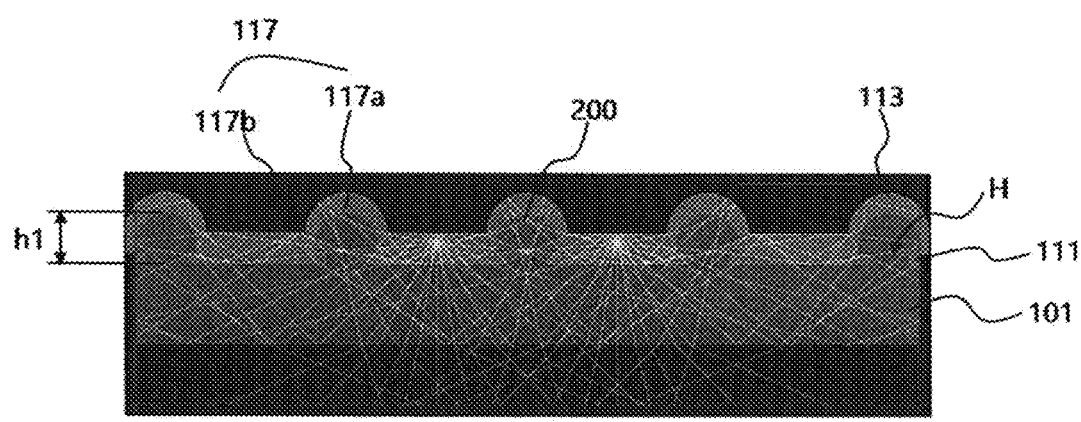
FIGS. 4C and 4D illustrate simulation results of a light extraction state of the OLED display according to a height of a insulating material of the OLED display according to the first embodiment of the present disclosure.
Figure 4D:
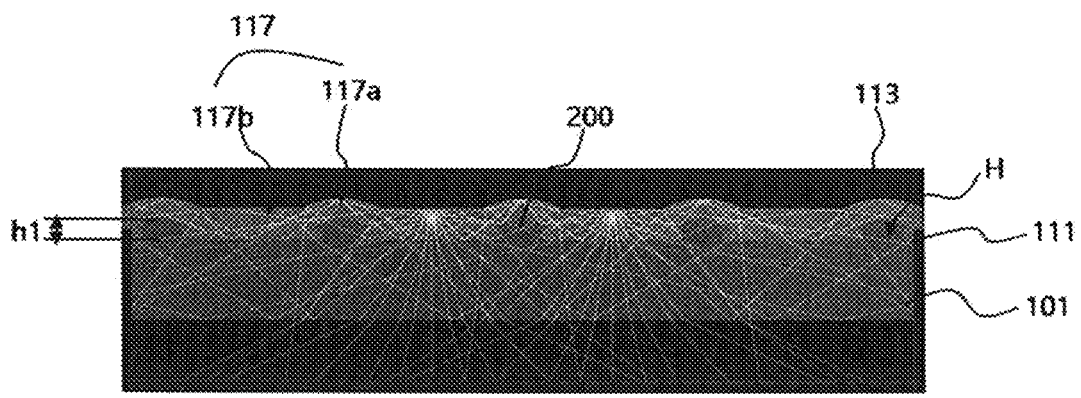

FIGS. 4A and 4B illustrate simulation results for a comparison of a measured light extraction state of the OLED display 100 according to the first embodiment of the present disclosure, and FIGS. 4C and 4D illustrate simulation results of a light extraction state of the OLED display 100 according to a height of the insulating material 200 of the OLED display 100 according to the first embodiment of the present disclosure.

Prior to the description, FIG. 4A illustrates an OLED display in which a first electrode, an organic light-emitting layer, and a second electrode are sequentially stacked on an overcoat layer corresponding to an emission region in one pixel region to constitute an LED, and a plurality of insulating materials are disposed and spaced apart from each other on an upper portion of the first electrode.

FIG. 4B illustrates the OLED display (100 of FIG. 1) according to the first embodiment of the present disclosure, in which the first electrode 111 having the plurality of holes H, the organic light-emitting layer 113, and the second electrode (115 of FIG. 3) are sequentially stacked on the overcoat layer (108 of FIG. 3) corresponding to the emission region (EA of FIG. 1) in one pixel region (SP of FIG. 1) to constitute the LED (E of FIG. 3), and the insulating material 200 is disposed in each of the holes H of the first electrode 111.

Referring to FIG. 4A, it can be confirmed that a large amount of light is totally reflected at an interface between the first electrode and the insulating material. The light totally reflected at the interface between the first electrode and the insulating material has an angle greater than a total reflection critical angle and thus is trapped between the overcoat layer and the first electrode or between the first electrode and the second electrode without being extracted to the outside of the substrate.

On the contrary, referring to FIG. 4B, it can be confirmed that an amount of light totally reflected at an interface between the first electrode 111 and the insulating material 200 is smaller as compared with that of FIG. 4A. In particular, it can be confirmed that an amount of light extracted to the outside of the substrate (101 of FIG. 1) is greater as compared with that of FIG. 4A.

That is to say, as in the first embodiment of the present disclosure, since the plurality of holes H are formed in the first electrode 111 disposed on the upper portion of the overcoat layer (108 of FIG. 3) corresponding to the emission region (EA of FIG. 1) and the insulating material 200 is disposed in each of the holes H, while light extraction efficiency is improved through the microlens (117 of FIG. 3) of the organic light-emitting layer 113 and the second electrode (115 of FIG. 3), the light totally reflected at the interface between the first electrode 111 and the insulating material 200 can also be extracted to the outside of the substrate (101 of FIG. 1).

Therefore, the light extraction efficiency can be further improved, thereby improving brightness of the OLED display (100 of FIG. 1) without consuming additional power and preventing a reduction in lifespan of the OLED display (100 of FIG. 1).

Meanwhile, referring to the accompanying FIGS. 4C and 4D with FIG. 4B illustrating the OLED display (100 of FIG. 1) according to the first embodiment of the present disclosure, in which the first electrode 111 having the plurality of holes H, the organic light-emitting layer 113, and the second electrode (115 of FIG. 3) are sequentially stacked on the overcoat layer (108 of FIG. 3) corresponding to the emission region (EA of FIG. 1) in one pixel region (SP of FIG. 1) to constitute the LED (E of FIG. 3) and the insulating material 200 is disposed in each of the holes H of the first electrode 111, as a height h1 of the insulating material 200 is increased, an amount of light extracted to the outside of the substrate 101 can be increased. Thus, it is preferable that the height h1 of the insulating material 200 is in a range of 5,000 Å to 9,000 Å.

Here, when the height h1 of the insulating material 200 is less than 5,000 Å, it is difficult to expect light extraction efficiency by the insulating material 200. When the height h1 of the insulating material 200 is greater than 9,000 Å, light incident from the LED (E of FIG. 3) may not travel toward the substrate (101 of FIG. 1) but rather may be trapped inside the LED (E of FIG. 3). Thus, light extraction efficiency may be lowered.

Therefore, the height h1 of the insulating material 200 can be set in a range of 5,000 Å to 9,000 Å, thereby maximizing light extraction efficiency.

As described above, in the OLED display (100 of FIG. 1) according to the first embodiment of the present disclosure, since the plurality of holes H are formed in the first electrode 111 of the LED (E of FIG. 3) and the insulating material 200 is disposed in each of the holes H so as to protrude convexly from the first electrode 111, the organic light-emitting layer 113 and the second electrode (115 in FIG. 3) constitute the microlens (117 of FIG. 3), thereby improving light extraction efficiency of the OLED display (100 of FIG. 1).

As a result, brightness can be improved, and power consumption can be reduced.

In particular, the OLED display (100 of FIG. 1) according to the first embodiment of the present disclosure, since the plurality of holes H are formed in the first electrode 111, and the insulating material 200 is disposed in each of the plurality of holes H, the interface between the insulating material 200 and the first electrode 111 can be reduced, thereby further improving light extraction efficiency.

Second Embodiment

Figure 5:
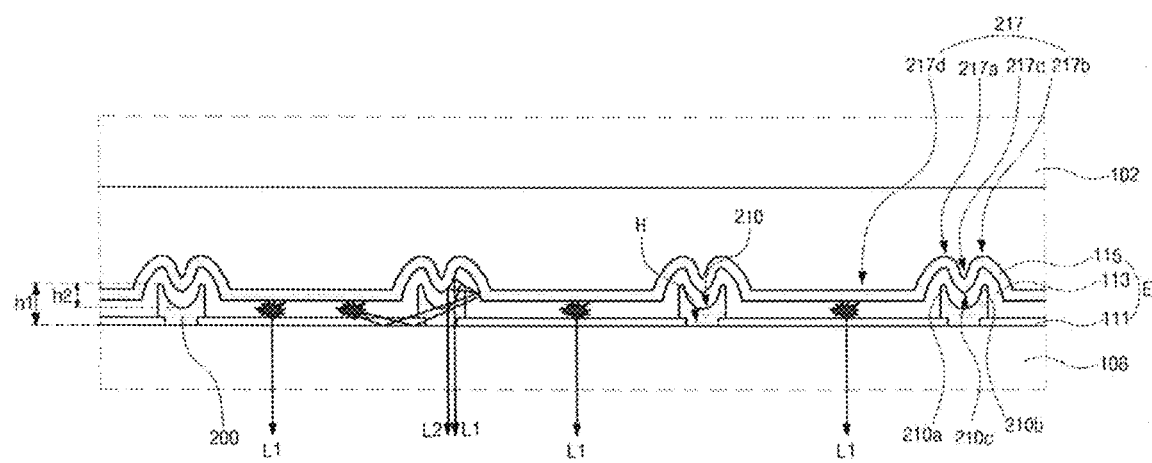
FIG. 5 is a schematic view illustrating a state in which light is guided according to a second embodiment of the present disclosure.

FIG. 5 is a schematic view illustrating a state in which light is guided according to a second embodiment of the present disclosure.

As shown, an LED E including a first electrode 111, an organic light-emitting layer 113, and a second electrode 115 is disposed on an upper portion of an overcoat layer 108 corresponding to an emission region (EA of FIG. 1) of one pixel region (SP of FIG. 1).

Here, the first electrode 111 has a plurality of holes H spaced apart from each other by a certain distance, and a insulating material 200 is disposed in each of the holes H.

The insulating material 200 is made of a transparent insulating material and has first and second protrusions 210a and 210b protruding convexly to a protective film 102 from each of the holes H of the first electrode 111 and a concave portion 210c which connects the first and second protrusions 210a and 210b and is concave toward the first electrode 111.

The organic light-emitting layer 113 and the second electrode 115 are sequentially disposed on the first electrode 111 and the insulating material 200. The organic light-emitting layer 113 and the second electrode 115 have first and second convex portions 217a and 217b corresponding to the first and second protrusions 210a and 210b of the insulating material 200, a groove 217c corresponding to the concave portion 210c of the insulating material 200, and a flat portion 217d corresponding to the first electrode 111 along surfaces of the first electrode 111 and the insulating material 200, which thus constitutes a microlens 217.

Here, since a refractive index of the organic light-emitting layer 113 is substantially the same as a refractive index of the first electrode 111, an optical path of light generated in the organic light-emitting layer 113 is not changed at an interface between the organic light-emitting layer 113 and the first electrode 111.

The organic light-emitting layer 113 and the first electrode 111 may have a refractive index in a range of 1.7 to 2.0.

Since the overcoat layer 108 has a refractive index of about 1.5, while light emitted from the organic light-emitting layer 113 passes through the first electrode 111 and is extracted to the outside of a substrate (101 of FIG. 1), the light emitted from the organic light-emitting layer 113 is totally reflected at an interface between the first electrode 111 and the overcoat layer 108.

In this case, among the light totally reflected at the interface between the first electrode 111 and the overcoat layer 108, light L1 is extracted to the outside of the substrate (101 of FIG. 1). However, some light has an angle greater than a total reflection critical angle and thus is trapped between the overcoat layer 108 and the first electrode 111 or between the first electrode 111 and the second electrode 115 without being extracted to the outside of the substrate (101 of FIG. 1).

In an OLED display (100 of FIG. 1) according to a second embodiment of the present disclosure, since the organic light-emitting layer 113 and the second electrode 115 constitute the microlens 217 having the first and second convex portions 217a and 217b and the groove 217c, among light totally reflected at an interface between the organic light-emitting layer 113 and the overcoat layer 108, some light L2 is extracted to the outside of the substrate (101 of FIG. 1) through multiple reflections by traveling at an angle smaller than a total reflection critical angle due to curved shapes of the first and second convex portions 217a and 217b and the groove 217c of the organic light-emitting layer 113 and the second electrode 115.

Therefore, light extraction efficiency is improved.

That is, although the OLED display (100 of FIG. 1) according to the second embodiment of the present disclosure does not include a separate microlens, the organic light-emitting layer 113 and the second electrode 115 may constitute the microlens 217 by the insulating material 200 and the first electrode 111, thereby improving light extraction efficiency.

In particular, since the organic light-emitting layer 113 and the second electrode 115 constitute the microlens 217 having the first and second convex portions 217a and 217b, the groove 217c, and the flat portion 217d, a curved area is increased by the first and second convex portions 217a and 217b and the groove 217c, thereby increasing a reflective area.

Therefore, light extraction efficiency can be further improved.

In this case, total reflection may also be performed at an interface between the first electrode 111 and the insulating material 200. In the OLED display (100 of FIG. 1) according to the second embodiment of the present disclosure, the plurality of holes H are formed in the first electrode 111, and the insulating material 200 is disposed in each of the plurality of holes H, thereby reducing the interface between the insulating material 200 and the first electrode 111.

Therefore, among light totally reflected at the interface between the first electrode 111 and the insulating material 200 among the light emitted from the organic light-emitting layer 113, light L3 is extracted to the outside of the substrate (101 of FIG. 1) through multiple reflections by traveling at an angle smaller than a total reflection critical angle due to the curved shapes of the first and second convex portions 217a and 217b and the groove 217c of the organic light-emitting layer 113 and the second electrode 115. As a result, light extraction efficiency is also improved.

Figure 6A:
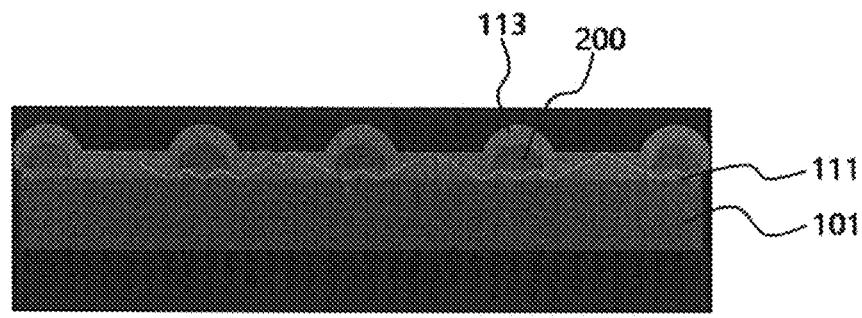
FIGS. 6A and 6B illustrate simulation results for a comparison of a measured light extraction state of an OLED display according to a second embodiment of the present disclosure.
Figure 6B:
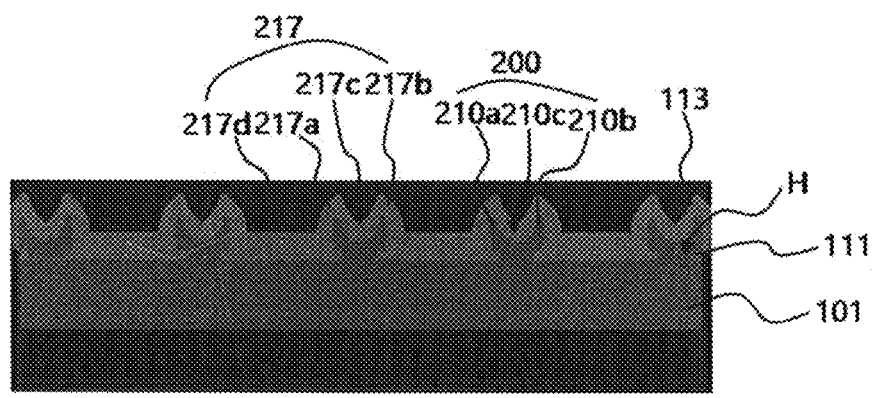

FIGS. 6A and 6B illustrate simulation results for a comparison of a measured light extraction state of the OLED display 100 according to the second embodiment of the present disclosure.

Figure 6C:
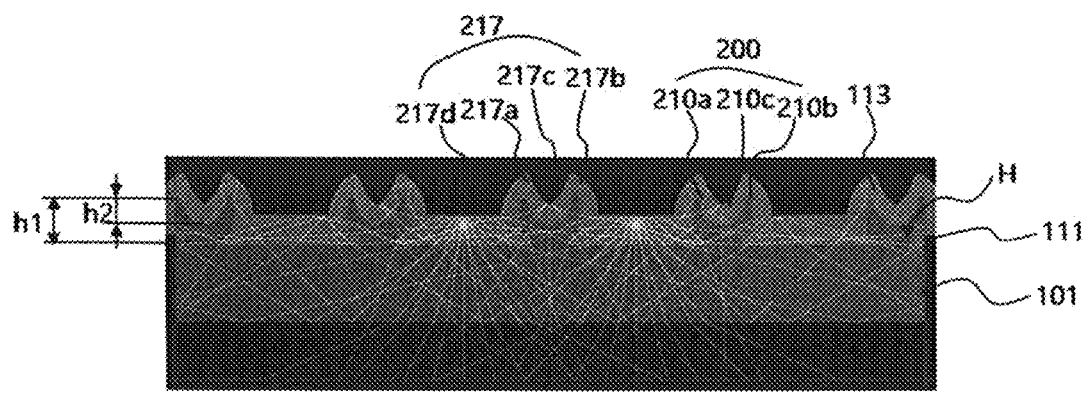
FIGS. 6C to 6E illustrate simulation results of measurement of a light extraction state of the OLED display according to a height of a concave portion of a insulating material of the OLED display according to the second embodiment of the present disclosure.
Figure 6D:
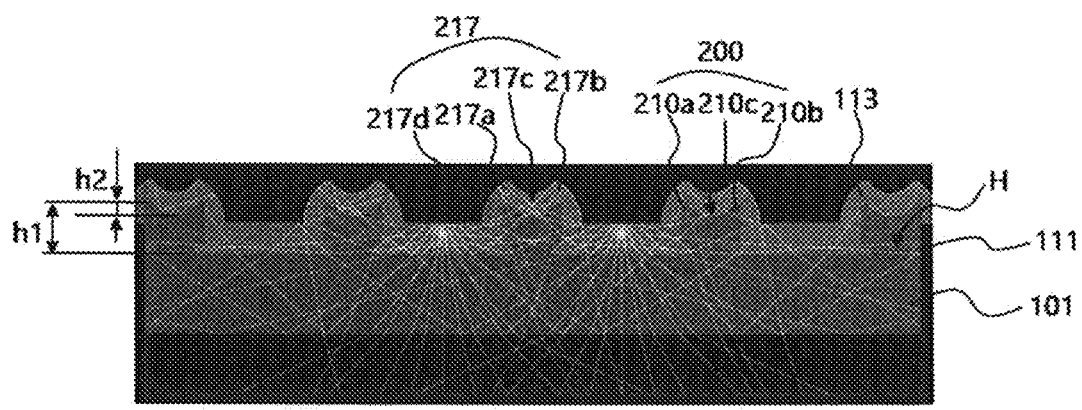
Figure 6E:
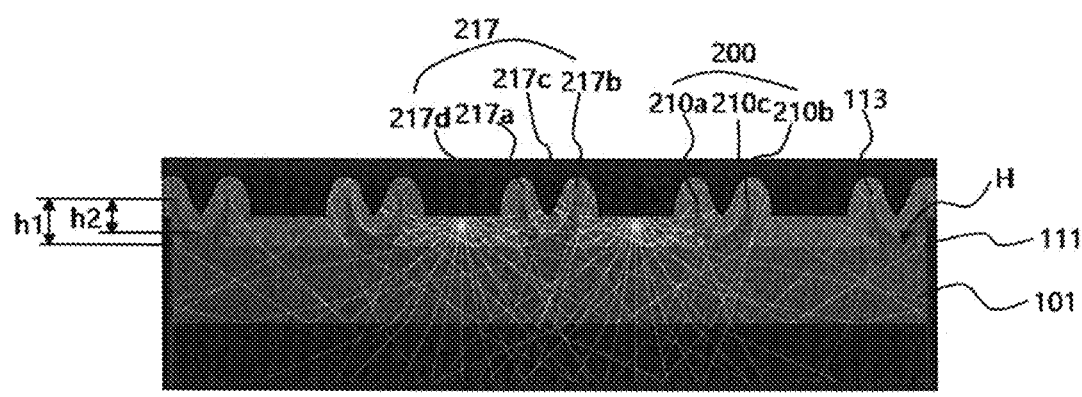

FIGS. 6C to 6E illustrate simulation results of measurement of a light extraction state of the OLED display 100 according to a height of the concave portion 210c of the insulating material 200 of the OLED display 100 according to the second embodiment of the present disclosure.

Prior to the description, FIG. 6A illustrates an OLED display in which a first electrode, an organic light-emitting layer, and a second electrode are sequentially stacked on an overcoat layer corresponding to an emission region in one pixel region to constitute an LED, and a plurality of insulating materials are disposed and spaced apart from each other on an upper portion of the first electrode.

FIG. 6B illustrates the OLED display (100 of FIG. 1) according to the second embodiment of the present disclosure, in which the first electrode 111 having the plurality of holes H, the organic light-emitting layer 113, and the second electrode (115 of FIG. 5) are sequentially stacked on the overcoat layer (108 of FIG. 5) corresponding to the emission region (EA of FIG. 1) in one pixel region (SP of FIG. 1) to constitute the LED (E of FIG. 5), and the insulating material 200 having the first and second protrusions 210a and 210b and the concave portion 210c is disposed in each of the holes H of the first electrode 111.

In this case, the organic light-emitting layer 113 and the second electrode 115 have the first and second convex portions 217a and 217b corresponding to the first and second protrusions 210a and 210b of the insulating material 200, the groove 217c corresponding to the concave portion 210c of the insulating material 200, and the flat portion 217d corresponding to the first electrode 111, which thus constitutes the microlens 217.

Referring to FIG. 6A, some of the light emitted from the organic light-emitting layer is totally reflected at an interface between the first electrode and the overcoat layer. In this case, it can be confirmed that some of the light reflected at the interface between the first electrode and the overcoat layer is also totally reflected at an interface between the first electrode and the insulating material.

Thus, light is trapped at the interface between the first electrode and the overcoat layer and at the interface between the first electrode and the insulating material.

On the contrary, referring to FIG. 6B, some of the light emitted from the organic light-emitting layer 113 is totally reflected at an interface between the first electrode 111 and the overcoat layer 108. In this case, it can be confirmed that some of the light totally reflected at the interface between the first electrode 111 and the overcoat layer 108 passes through the insulating material 200 and is reflected by the second electrode (115 of FIG. 5) without being totally reflected at an interface between the first electrode 111 and the insulating material 200.

The light reflected by the second electrode (115 in FIG. 5) is extracted to the outside of the substrate 101.

Therefore, in the OLED display (100 of FIG. 1) according to the second embodiment of the present disclosure, since the plurality of holes H are formed in the first electrode 111 disposed on the upper portion of the overcoat layer 108 corresponding to the emission region (EA of FIG. 1) and the insulating material 200 having the first and second protrusions 210a and 210b and the concave portion 210c is disposed in each of the holes H, while light extraction efficiency is improved through the microlens (217 of FIG. 5) of the organic light-emitting layer 113 and the second electrode (115 of FIG. 5), the light totally reflected at the interface between the first electrode 111 and the insulating material 200 can also be extracted to the outside of the substrate (101 of FIG. 1).

Therefore, the light extraction efficiency can be further improved, thereby improving brightness of the OLED display (100 of FIG. 1) without consuming additional power, and preventing a reduction in lifespan of the OLED display (100 of FIG. 1).

On the other hand, referring to FIGS. 6C and 6D, it can be confirmed that as a height h2 of the concave portion 210c of the insulating material 200 is increased, an amount of light extracted to the outside of the substrate (101 of FIG. 1) is increased. Thus, it is preferable that the height h2 of the concave portion 210c is in a range of ⅓ to ⅔ of a height h1 of the insulating material 200.

That is, a case in which the height h1 of the insulating material 200 is in a range of 5,000 Å to 9,000 Å is most appropriate for light extraction efficiency. Here, the height h2 of the concave portion 210c is in a range of 1,600 Å to 6,000 Å.

When the height h2 of the concave portion is less than ⅓ of the height h1 of the insulating material 200, it is difficult to expect an increase effect of a curved surface by the concave portion 210c. When the height h2 of the concave portion 210c is greater than ⅔ of the height h1 of the insulating material 200, due to limitations in an exposure ratio and a material itself in a current process, it is difficult to form the concave portion 210c. In addition, light incident from the LED (E of FIG. 5) may not travel toward the substrate (101 of FIG. 1) but rather may be trapped inside the LED (E of FIG. 5). Thus, light extraction efficiency may be lowered.

Therefore, it is preferable that the height h2 of the concave portion 210c of the insulating material 200 is in a range of ⅓ to ⅔ of the height h1 of the insulating material 200. The desired height and shape of the insulating material 200 having first and second protrusions 210a and 210b and the concave portion 210c configured is made by the following steps: forming an insulating material layer on the first electrode; forming first photoresist patterns having different thickness on the insulating material layer; first etching the insulating material layer using the first photoresist patterns; forming second photoresist patterns by ashing; second etching the insulating material layer using the second photoresist patterns; forming third photoresist patterns by ashing; third etching the insulating material layer using the third photoresist pattern; and removing the third photoresist patterns.

As described above, in the OLED display (100 of FIG. 1) according to the second embodiment of the present disclosure, since the plurality of holes H are formed in the first electrode 111 of the LED (E of FIG. 5) and the insulating material 200 having the first and second protrusions 210a and 210b and the concave portion 210c configured to connect the first and second protrusions 210a and 210b is disposed in each of the holes H, the organic light-emitting layer 113 and the second electrode (115 in FIG. 5) constitute the microlens 217 having the curved shapes of the first and second convex portions 217a and 217b and the groove 217c, thereby improving light extraction efficiency of the OLED display (100 of FIG. 1).

As a result, brightness can be improved, and power consumption can be reduced.

In particular, the OLED display (100 of FIG. 1) according to the second embodiment of the present disclosure, since the plurality of holes H are formed in the first electrode 111, and the insulating material 200 is disposed in each of the plurality of holes H, the interface between the insulating material 200 and the first electrode 111 can be reduced, thereby further improving light extraction efficiency.

As described above, according to the present disclosure, since a plurality of holes are formed in a first electrode of an LED and a insulating material is disposed in each of the holes, an organic light-emitting layer and a second electrode constitute a microlens, thereby improving light extraction efficiency of an OLED display.

As a result, brightness can be improved, and power consumption can be reduced.

In particular, since the plurality of holes are formed in the first electrode and the insulating material is disposed in each of the plurality of holes, an interface between the insulating material and the first electrode is decreased, thereby further improving light extraction efficiency.

The present disclosure is not limited to the above-described embodiments, and it will be apparent to those skilled in the art that various modifications and variations can be made in the present disclosure without departing from the spirit or scope of the invention.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light emitting diode display device, comprising a plurality of pixel regions, each of the pixel regions comprising a light-emitting diode (LED) in an emission region, the LED comprising:
a first electrode having a plurality of holes formed therein, the plurality of holes disposed in the emission region of each of the pixel regions;
a plurality of bank patterns disposed in the plurality of holes and protruding from the first electrode, the plurality of bank patterns disposed in the emission region of each of the pixel regions;
an organic light-emitting layer disposed on upper surfaces of the first electrode and the plurality of bank patterns;
a second electrode disposed on the organic light-emitting layer; and
a wavelength conversion layer corresponding to the emission region of each of the pixel regions,
wherein both of the organic light-emitting layer and the second electrode have a shape that conforms to the upper surfaces of the first electrode and the plurality of bank patterns,
wherein the plurality of bank patterns are disposed inside a region where the wavelength conversion layer is disposed such that the plurality of bank patterns completely overlap the wavelength conversion layer.

2. The organic light emitting diode display device of claim 1, wherein the organic light-emitting layer and the second electrode constitute a microlens.

3. The organic light emitting diode display device of claim 2, wherein the microlens has a curved shape that improves light extraction efficiency of the OLED display device.

4. The organic light emitting diode display device of claim 1, further comprising an overcoat layer under a lower surface of the first electrode, wherein light totally reflected at an interface between the first electrode and the overcoat layer is extracted through one or more reflections by travelling at an angle smaller than a total reflection critical angle due to a microlens constituted by the organic light-emitting layer and the second electrode.

5. The organic light emitting diode display device of claim 1, wherein the plurality of holes are formed in the first electrode in a hexagonal honeycomb structure.

6. The organic light emitting diode display device of claim 1, wherein the plurality of holes are spaced apart from each other by a certain distance.

7. The organic light emitting diode display device of claim 6, wherein the plurality of holes formed in the first electrode reduce interfaces between the bank patterns and the first electrode, and wherein the plurality of bank patterns surround a front edge surface and a side surface of the first electrode adjacent to the plurality of holes.

8. The organic light emitting diode display device of claim 1, wherein the bank pattern disposed in each of the holes has a width of 8000 Å to 12000 Å.

9. The organic light emitting diode display device of claim 1, wherein a width between adjacent bank patterns is about three times a width of a bank pattern.

10. The organic light emitting diode display device of claim 1, further comprising a bank disposed along an edge of the pixel region.

11. The organic light emitting diode display device of claim 10, wherein the bank pattern is made of the same material as the bank, and the bank pattern is disposed in the same process as the bank.

12. An organic light emitting diode display device, comprising a plurality of pixel regions, each of the pixel regions comprising a light-emitting diode (LED), the LED comprising:
a first electrode having a plurality of holes formed therein;
a bank pattern disposed in each of the holes and protruding from the first electrode;
an organic light-emitting layer disposed on upper surfaces of the first electrode and the bank pattern; and
a second electrode disposed on the organic light-emitting layer,
wherein both of the organic light-emitting layer and the second electrode have a shape that conforms to the upper surfaces of the first electrode and the bank pattern, and
wherein the bank pattern has a semicircular shape protruding from the first electrode,
wherein the shape of the organic light-emitting layer and the second electrode improves light extraction efficiency of the organic light-emitting diode display device.

13. The organic light emitting diode display device of claim 12, wherein the organic light-emitting layer and the second electrode have a convex portion corresponding to the bank pattern and a flat portion corresponding to the first electrode.

14. The organic light emitting diode display device of claim 12, wherein an amount of light extracted to outside of the pixel region is increased as a height of the bank pattern is increased.

15. The organic light emitting diode display device of claim 14, wherein the height of the bank pattern is in a range of 5000 Å to 9000 Å.

16. An organic light emitting diode display device, comprising a plurality of pixel regions, each of the pixel regions comprising a light-emitting diode (LED), the LED comprising:
a first electrode having a plurality of holes formed therein;
a bank pattern disposed in each of the holes and protruding from the first electrode;
an organic light-emitting layer disposed on upper surfaces of the first electrode and the bank pattern; and
a second electrode disposed on the organic light-emitting layer,
wherein both of the organic light-emitting layer and the second electrode have a shape that conforms to the upper surfaces of the first electrode and the bank pattern, and
wherein the bank pattern has first and second protrusions protruding from the first electrode and a concave portion which connects the first and second protrusions and is concave toward the first electrode.

17. The organic light emitting diode display device of claim 16 wherein the organic light-emitting layer and the second electrode have first and second convex portions corresponding to the first and second protrusions of the bank pattern, a groove corresponding to the concave portion of the bank pattern, and a flat portion corresponding to the first electrode, wherein the first and second convex portions and the groove increase a curved area for light reflection.

18. The organic light emitting diode display device of claim 16, wherein an amount of light extracted to outside of the pixel region is increased as a height of the concave portion of the bank pattern is increased.

19. The organic light emitting diode display device of claim 18, wherein the height of the concave portion of the bank pattern is in a range of ⅓ to ⅔ of a height of the bank pattern.

* * * * *